(12) United States Patent
Buhl

(10) Patent No.: US 7,397,389 B2
(45) Date of Patent: Jul. 8, 2008

(54) SYSTEM AND METHOD FOR RETROFITTING UTILITY METER READING MODULES

(76) Inventor: Kim Buhl, 1878 Kennard St., Maplewood, MN (US) 55109

( * ) Notice: Subject to any disclaimer, the term of this patent is extended or adjusted under 35 U.S.C. 154(b) by 1425 days.

(21) Appl. No.: 10/293,083

(22) Filed: Nov. 13, 2002

(65) Prior Publication Data

US 2003/0151886 A1 Aug. 14, 2003

Related U.S. Application Data

(60) Provisional application No. 60/356,983, filed on Feb. 12, 2002.

(51) Int. Cl.
G08B 23/00 (2006.01)
(52) U.S. Cl. .............. 340/870.02; 724/116; 724/103 R; 73/861.77
(58) Field of Classification Search ............ 340/870.02, 340/870.03; 324/160, 163, 115, 153, 103 R, 324/116; 73/861, 861.78, 861.77
See application file for complete search history.

(56) References Cited

U.S. PATENT DOCUMENTS

| | | | |
|---|---|---|---|
| 3,816,714 A | 6/1974 | Reed ............................ 235/94 |
| 4,207,733 A | 6/1980 | Copeland et al. ............ 368/108 |
| 4,313,825 A | 2/1982 | Fleckenstein et al. ......... 210/89 |
| 4,581,606 A | 4/1986 | Mallory ....................... 340/539 |
| 4,977,577 A | 12/1990 | Arthur et al. .................... 375/1 |
| 5,067,136 A | 11/1991 | Arthur et al. .................... 375/1 |
| 5,119,396 A | 6/1992 | Snderford, Jr. ................... 375/1 |
| 5,209,258 A * | 5/1993 | Sharp et al. .................. 137/343 |
| 5,373,336 A | 12/1994 | Sugita .......................... 354/202 |
| 5,376,776 A | 12/1994 | Paese et al. .................... 235/95 |
| 5,408,217 A | 4/1995 | Sanderford, Jr. ............. 340/506 |
| 5,421,201 A | 6/1995 | Pellerin, Jr. .................... 73/272 |
| 5,457,713 A | 10/1995 | Sanderford, Jr. et al. ..... 375/206 |
| 5,699,976 A | 12/1997 | Hori ............................. 242/374 |
| 5,777,222 A | 7/1998 | Roberts ......................... 73/273 |
| 6,100,816 A | 8/2000 | Moore ..................... 340/870.02 |
| 6,435,042 B1 | 8/2002 | Puseman et al. .......... 73/861.78 |
| 6,523,427 B1 * | 2/2003 | Ferguson .................... 73/866.5 |
| 6,729,249 B2 * | 5/2004 | Sauder et al. ................ 111/177 |

(Continued)

OTHER PUBLICATIONS

Schematic of Handhole Plate Assemblies, pp. 1.

(Continued)

*Primary Examiner*—Albert K. Wong
(74) *Attorney, Agent, or Firm*—Patterson, Thuente, Skaar & Christensen, P.A.

(57) ABSTRACT

The system and methods of the present invention generally include retrofitting at least one shrouding device that is associated with a meter reading module drive shaft that operates within a meter reading module housing. Including at least one shrouding device about the meter reading module drive shaft substantially reduces rotational wiggle or play of the drive shaft within the housing of the meter reading module during operation by reducing the void between an outer surface of the drive shaft and an inner surface of a drive shaft channel of the housing, and/or by reducing the effects of tapered shafts or drive channels. In one embodiment, the shrouding device includes a sleeve device substantially secured around a portion of the shaft confined within the drive channel during rotational operation. In alternative embodiments, at least one bushing is secured to the shaft at one or more predefined portions of the shaft.

48 Claims, 7 Drawing Sheets

U.S. PATENT DOCUMENTS 6,982,651 B2 *   1/2006   Fischer .................. 340/870.02

OTHER PUBLICATIONS

Schematic of Aluminumcase Meters, pp. 1.
*Sprague Meter Company New Top Casting Assembly for Sprague 400 CFH Meters Features Top-Mounted I.D.M.*, Jun. 1973, pp. 1.
*Sprague Meter Company Meter Disassembly*, pp. 1.
*Itron Specifications for 40G Commercial ERT*, 1993, pp. 1.
*Itron Specifications for Direct-mount ERT Module*, 1994, pp. 1.
*Itron ERT Module Model 40G Commercial*, pp. 1.
*Itron ERT Module Model 40G*, pp. 1.
Schematic view of Module including Top Plate Assembly and Internal Housing Assembly, pp. 1.
*Genesis Network by Itron Distribution Automation System Drives AMR at Con Edison*, Jan. 1994, pp. 1.
Schematic of Meter, pp. 1.

* cited by examiner

SYSTEM AND METHOD FOR RETROFITTING UTILITY METER READING MODULES

RELATED APPLICATIONS

This application claims priority to U.S. Provisional Patent Application No. 60/356,983 filed Feb. 12, 2002, which is incorporated by reference herein in its entirety.

FIELD OF THE INVENTION

The present invention relates generally to utility meters and, more particularly, to a system and method for retrofitting utility meter reading modules to substantially stabilize operational rotation of a meter reader module drive shaft within a drive shaft channel by utilizing at least one shrouding device.

BACKGROUND OF THE INVENTION

Remote utility meter reading modules are implemented with stand-alone utility meters to provide a means of transmitting consumption data from the meter to various remote meter reading devices and/or networks. These meter reading modules can promote efficiency and accuracy since they enable utility companies to read the consumption data without the need for an army of manual meter readers.

Conventional utility meter systems include a meter unit and a register index operably connected to the meter unit. Fluid flow, such as gas, through the meter unit drives an internal meter drive system in operable communication with the register index such that rotations from the meter drive system are communicated through to the register. Generally, a series of external dials on the register index provide various indicators of consumption. However, while mechanically efficient, manual reading of consumption data from such utility meter systems presents innate drawbacks.

First, manual reading can introduce a measurable degree of error into the process. Second, even in rural areas and small towns, the shear number of people and hours required to visually inspect, record, and collate the data for each operational meter can equate to substantial monetary costs.

To get away from manual and isolated utility metering systems, meter reading modules are often employed. These meter reading modules are operably connected between the meter and the register index. As such, the meter reading modules are intended to communicate and intercept the mechanical rotations described. Generally, the meter reading module includes interfaces on opposite sides of a meter reading module drive shaft for rotationally communicating with and between the register index and the meter. The intercepted rotations are transmitted by a transmitter, or transceiver, on to various remote reading devices and/or networks, generally through radio frequency (RF) communications.

Unfortunately, some of these meter reading modules have experienced malfunctions and problems. Rotational communications through the meter reading modules are often jumpy and binding. Such undesirable mechanical rotations through the meter reading modules can seriously damage the internal gear system of the meter unit, and can produce inaccurate consumption readings, or no readings at all. In some cases, these malfunctions can further cause dangerous gas leaks and/or a complete breakdown of the meter units. As a result, dwellings, commercial buildings, and the like become vulnerable to the real and potentially catastrophic effects of the defects.

To date, these malfunctions and their effects on the respective equipment have been blamed on user installation errors. Specifically, it is generally believed that field personnel apply too much pressure on the meter reading modules during installation. This belief is based on the assumption that installation procedures are driving the meter reading drive shaft and its interfaces into forceable contact with components such as the meter drive system, thus resulting in distortion and buckling of the drive shaft. In response, procedures have been implemented wherein installers are instructed in great detail on how much optimal pressure should be applied during installation, the minimum torque required to properly fasten the meter reading module to the meter unit, and the like.

Despite these precautions, the malfunctions and resulting damage from malfunctions in the meter reading module continue to occur. While it is always possible to change the design of new meter reading modules, there are already millions of existing meter reading modules installed in the field that are subject to potential malfunction. Replacing all of the existing meter reading modules with new modules is economically impractical. As a result, there is a need for a system and method of repairing these defective meter reading modules and their mechanical interconnections such that the costs and dangers resulting from these malfunctions are substantially minimized.

SUMMARY OF THE INVENTION

The system and methods of the present invention generally include retrofitting at least one shrouding device that is associated with a meter reading module drive shaft that operates within a meter reading module housing. Including at least one shrouding device about the meter reading module drive shaft substantially reduces rotational wiggle or play of the drive shaft within the housing of the meter reading module during operation by reducing the void between an outer surface of the drive shaft and an inner surface of a drive shaft channel of the housing, and/or by reducing the effects of tapered shafts or drive channels. In one embodiment, the shrouding device includes a sleeve device substantially secured around a portion of the shaft confined within the drive channel during rotational operation. In alternative embodiments, at least one bushing is secured to the shaft at one or more predefined portions of the shaft.

The system and method in accordance with embodiments of the present invention addresses these meter reading module defects by providing various solutions to existing mechanical design flaws in the interfacing between the meter reading module and the meter and register index interfaces. In addition, embodiments of the present invention are directed to minimizing unacceptable wiggle in the meter reading module drive shaft during operational rotation. Various features of the present invention can be employed universally for numerous brand name meters, while other features will be directed to known problems present with specific brand name meters and interfaces.

Conventional attempts at fixing defective meter reading modules through the implementation of elaborative installation procedures have failed to address innate design flaws within the meter reading modules themselves. These design flaws generally relate to the rotational tolerances and the mechanical motion of the meter reading module components, and the interfaces between the drive shaft and the corresponding meter and/or register index.

In conventional gas meters, a meter drive system translates gas usage through the meter into measurable readings on the outside of the meter. Generally, this translation occurs through the interlinking of the internal workings of the meter to an index register housed external to the meter. Gas flow through the meter will cause rotation of an internal meter drive. This meter drive is operably connected to a corresponding index drive on the index register and, specifically, rotational elements on the index register that cause a corresponding rotation of visible register dials.

A key functional requirement in advancing accurate indications on the register dials that are truly representative of the gas flow through the meter lies in the operable engagement of the driving components mentioned. The meter drive and the index drives must be operably engaged in a manner that promotes fluid mechanical motion transfer therebetween. As such, the respective drive systems must be properly linked at an engagement region, wherein each of the drives has an end engagement device matable with the engagement device of the other drive.

The engagement device of the register index drive is referred to as an index interface mechanism. The engagement device of the meter drive is referred to as a meter interface mechanism. The index interface connects to a corresponding gear network within the register index drive system that permits translation of turns of the index interface into measurable movements within the gear network. While various brand name meters will often employ different meter and index interfaces, each is engageably linked to the other such that proper motion transfer is advanced. Companies can expend substantial research and development to providing a proper linkage of the interfaces to ensure proper conversion of the rotating motion representing fluid flow through the meter into consumption indications on the register.

The meter reading modules must provide means of engaging both the meter interface and the index interface such that mechanical rotation of the register index, and its corresponding dials, is maintained. Further, this intermediate or replacement rotational system must be electronically read to determine consumption While much forethought and innovation generally goes into the various electronic and related technologies for these meter reading modules, they are often lacking in mechanical efficiency and fluidity. The present invention realizes that it is these mechanical design defects, and not the installation procedures, that are the cause of the problematic and potentially dangerous mechanical malfunctions described herein. First, the drive shaft within the meter reading module that engages both the meter and the register index is generally housed within a drive channel in a manner promoting undesirable slop or wiggle during operational rotation. Wear and tear, drive shaft and/or drive channel tapering, and similar problems can disrupt fluid rotational motion of the drive shaft within the meter reading module. Second, the interface devices interlinking the meter reading module drive system to the index and the meter are often changed from the original design of the link between the meter and the register. These differences can result in jumpy and non-fluid binding rotations from the meter, through the meter reading module, and into the register index.

DETAILED DESCRIPTION OF THE INVENTION

Referring to FIGS. 1-13, a meter reading module retrofitting system 10 in accordance with the present invention is generally shown. The system 10 generally includes at least one shrouding device 12 operably surrounding specific components of a meter reading module device 18.

The shrouding device 12 can be made of various materials and can be of various shapes and sizes depending on the particular meter reading module, and meter reading module component designs. As will be discussed further herein, the configuration of the meter reading module can greatly influence the particular shape, size, and implementation of the shrouding device 12. To properly understand these variables, it is first necessary to describe various meter reading module embodiments, and their interaction with existing utility meters.

Figure 1:
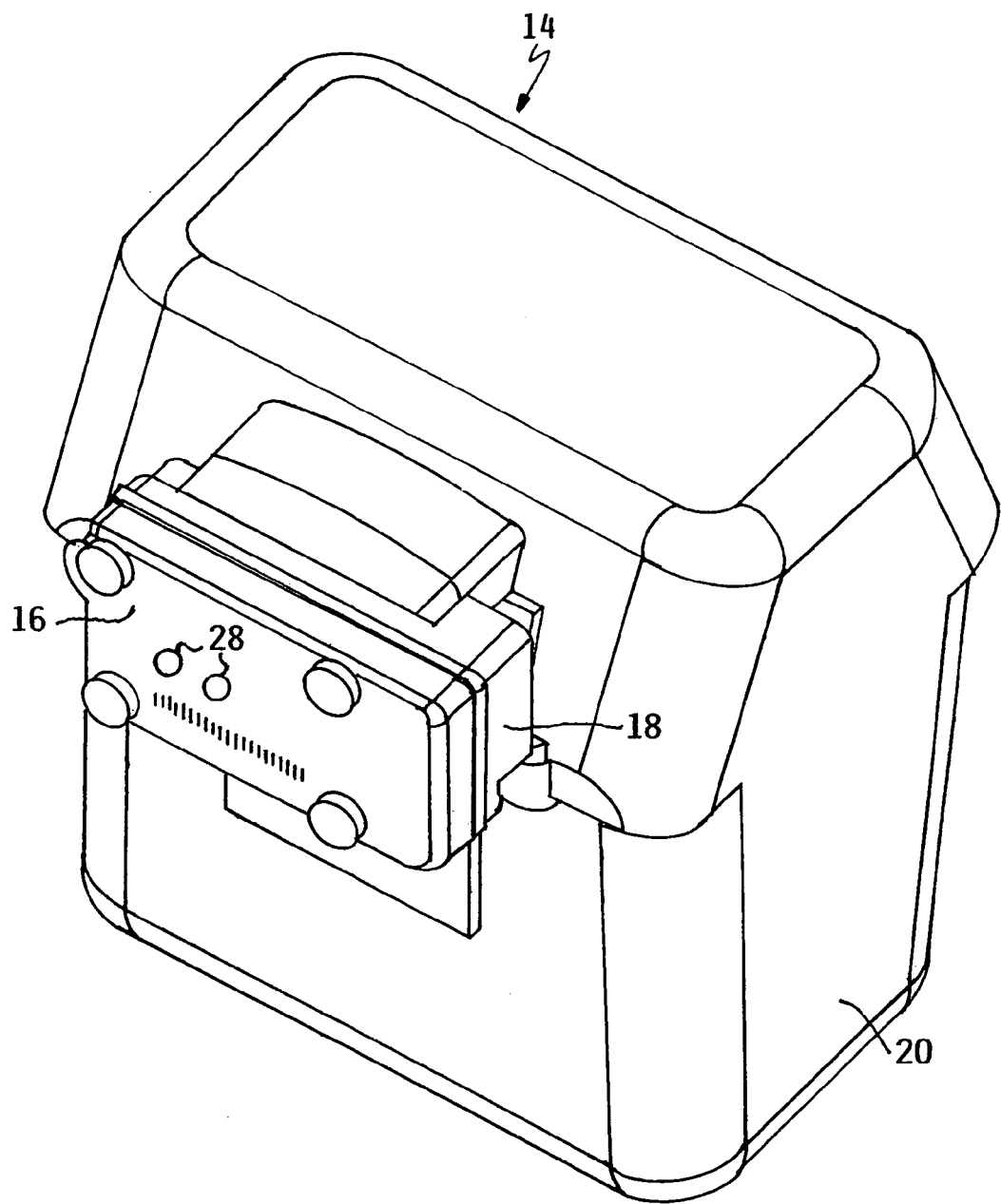
FIG. 1 is a perspective view of a utility meter and an operably connectable conventional meter reading module and register index.
Figure 2:
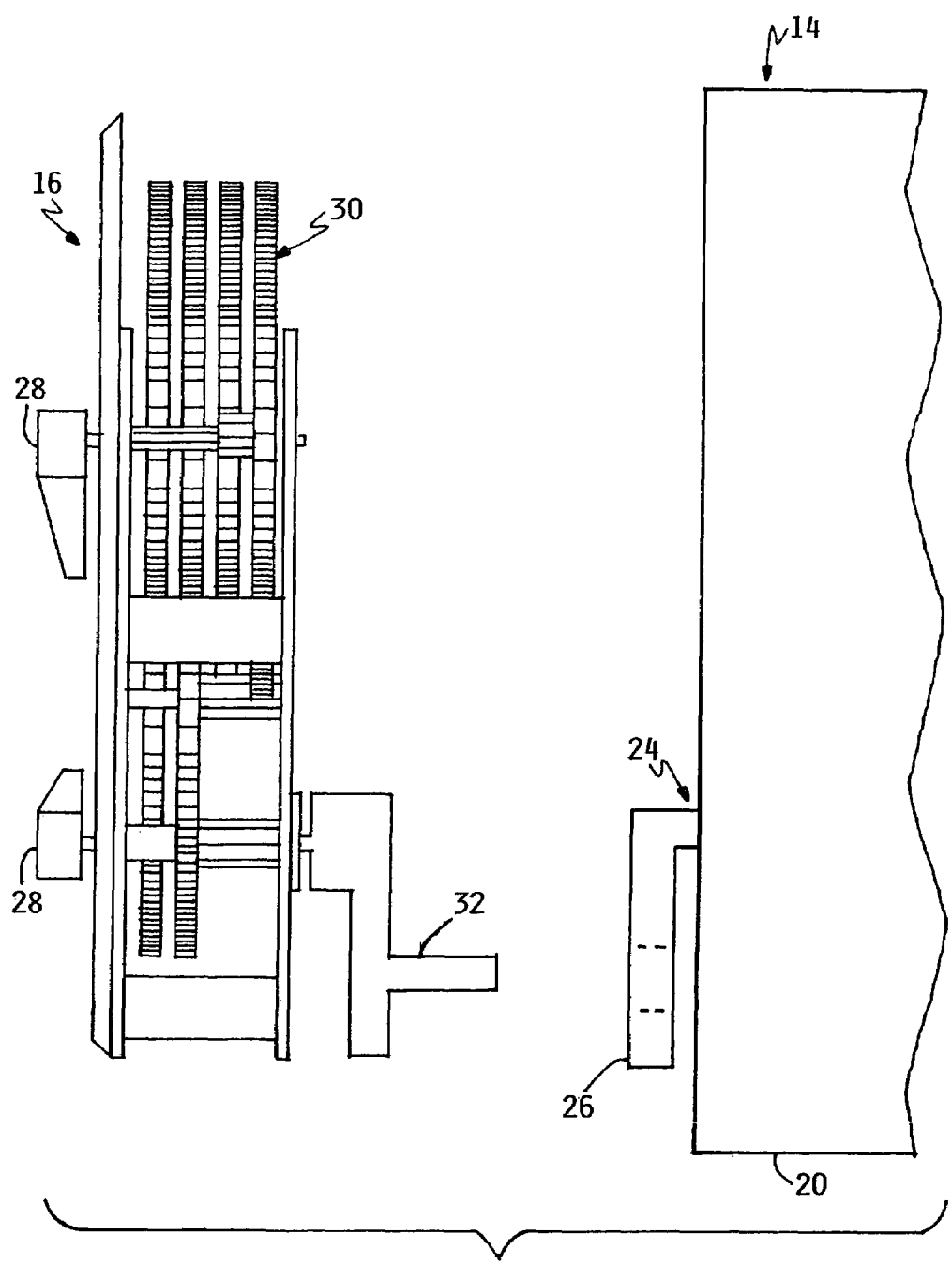
FIG. 2 is a side view of an operably linkable conventional register index and utility meter.
Figure 3:
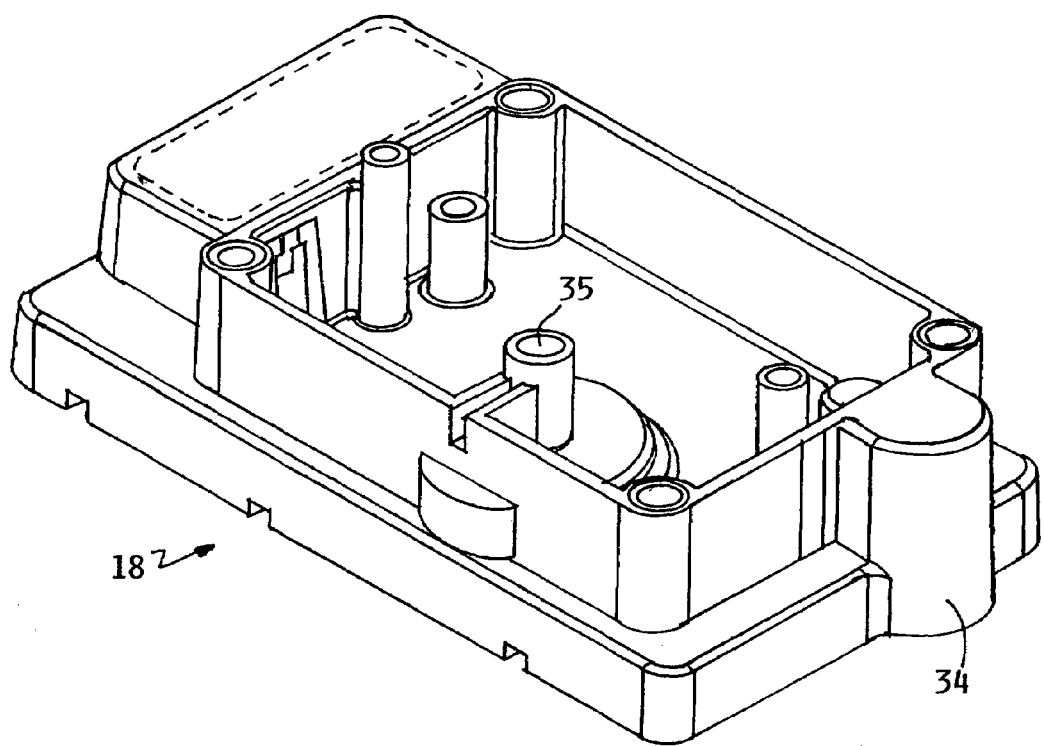
FIG. 3 is a perspective view of a portion of a conventional meter reading module housing.

Referring primarily to FIGS. 1-3, a utility meter 14 is shown. While the present invention is employable with a wide variety of meter types (i.e., water and electric) and brands, a relatively standard gas meter is utilized for demonstrative purposes. The meter 14 generally includes a meter housing 20, a meter gear system (not shown), and a meter drive system 24. A utility meter 14 is generally connected to a main service or gas line and controls and measures gas into a house, commercial building, or other structures. The fluid (i.e., gas) flow rates are controlled by the meter gear system. Further the internal meter gear system is operably connected to the meter drive system 24 such that variable flows through the meter 14 rotationally drive the meter drive system 24. The meter drive system 24 includes a meter interface mechanism 26 that is typically located on an external portion of the meter housing 20. As such, flow through the meter 14 initiates movement of the internal meter gear system, which in turn rotationally drives the meter drive system 24 such that the meter interface mechanism 26 external to the meter housing 20 provides a potential point of connectivity to receive consumption readings.

Typically, a register index 16 is operably connected to the meter interface mechanism 26, as best shown in FIGS. 1 and 2. The register index 16 generally includes at least one register dial 28, a gear network 30, and an index interface mechanism 32. The index interface mechanism 32 is the component of the index 16 that is operably connectable to the meter interface mechanism 26 of the meter 14. The index interface mechanism 32 can be further be operably connected to the gear network 30, which is connected to the at least one register dial 28. The at least one dial 16 is driven by the gear network 30. Often, an array of gears within the gear network 30 provide individual rotational indications for individually connected dials 28 to provide various visual indications of consumption. As the meter interface mechanism 26 rotationally drives the index interface mechanism 32 upon measurable gas flow through the meter 14, the rotation drives the gear network 30 and the corresponding dials 28.

The interlinking connection between the meter interface mechanism 26 and the index interface mechanism 32 is vitally important as it greatly influences the accuracy of the consumption readings at the register dials 28. Further, fluid motion through the described mechanical translation is required to preserve the functionality and life of the meter and index components. Binding, jumping, drive wiggle, and other undesirable events are preferably avoided since they can be quite costly and dangerous. As a result of this desire to obtain efficient and reliable mechanical performance, the tolerances of the individual components and their interaction with other components is relatively precise in design and execution.

With the advancement of remote transmissions and consumption reading devices and networks, standard meters 14 and register indexes 16 must be retrofitted with electronic meter reading module devices 18, either upon assembly or in the field. The housing and mechanical drive components of these meter reading modules 18 are designed to serve as an intermediary system for intercepting consumption data between the meter 14 and the register index 16. A conventional meter reading module 18 generally includes at least a meter reading module housing 34, and a meter reading module drive system 36. In alternative embodiments, the meter reading module 18 can include an integral register index.

Figure 4:
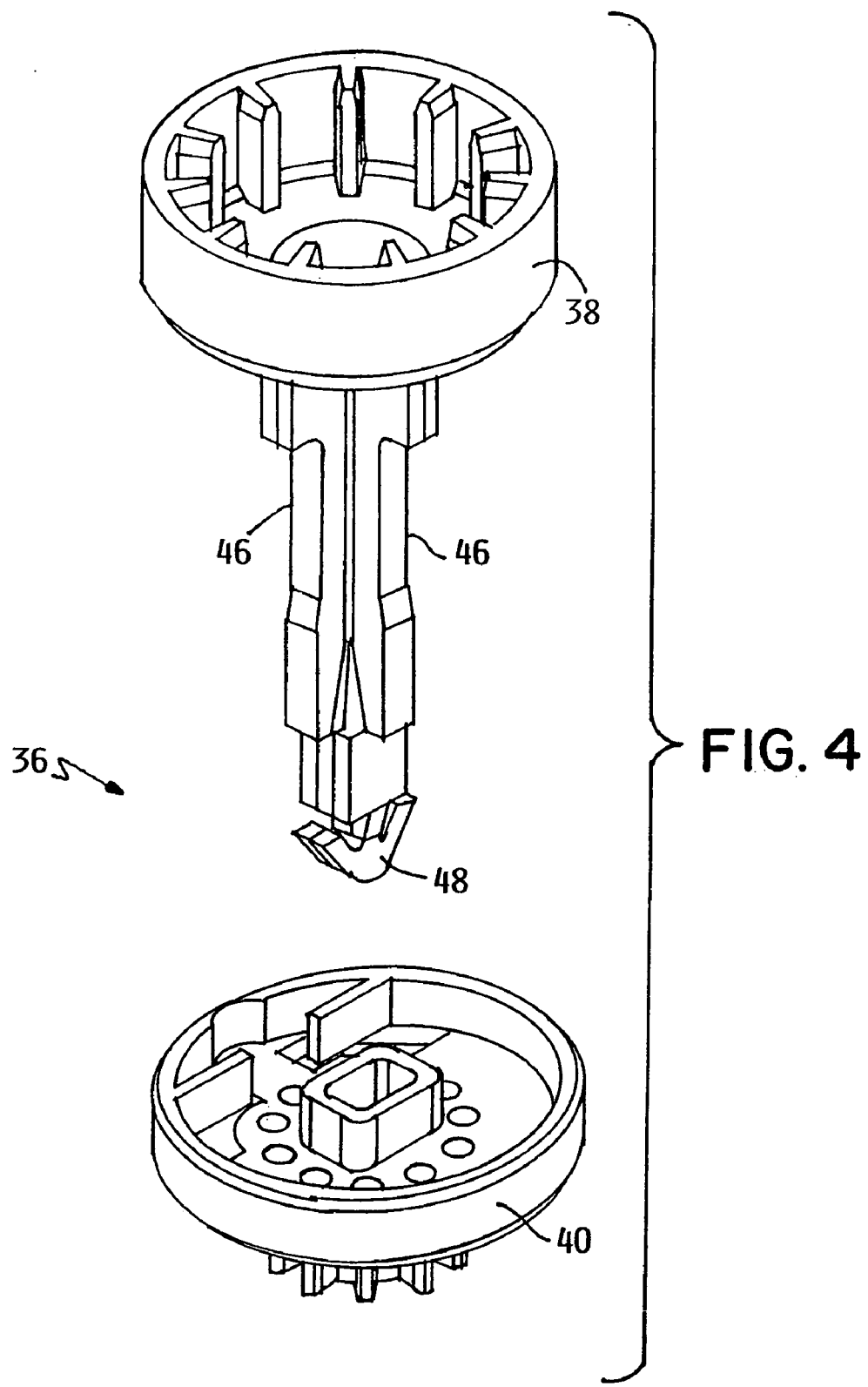
FIG. 4 is a an exploded view of a conventional meter reading module drive system.
Figure 5:
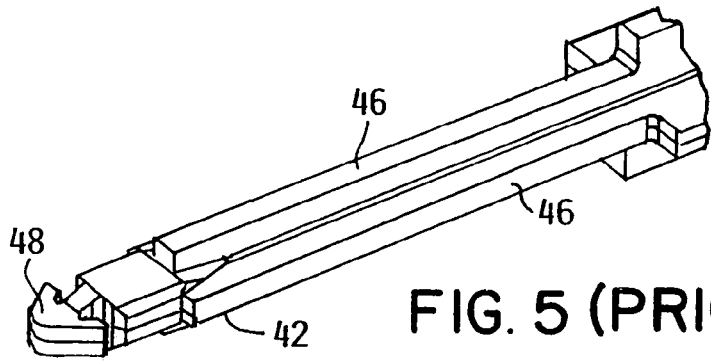
FIG. 5 is a perspective view of a conventional meter reading module drive shaft.

Referring to FIGS. 3-5, The module housing 34 includes a drive channel 35 designed to rotationally receive and surround at least a portion of the meter reading module drive system 36. The meter reading module drive system 36 can include a first interface 38, a second interface 40, and a drive shaft 42. The interfaces 38, 40, and the shaft 42 are generally constructed of plastics but can be made from a myriad of materials. The interfaces 38, 40 are adapted to interlink with the meter interface mechanism 26 and the index interface mechanism 32. For example, the first interface 38 can rotationally connect with the meter interface mechanism 26 of the meter 14 and the second interface 49 can rotationally connect with the index interface mechanism 32 of the register 16. It should be noted that the first interface 38, if capable of connectivity to the meter interface mechanism 26, is often referred to as a "meter dog", as demonstrated in FIG. 4. Similarly, the second interface 40, if capable of connectivity to the index interface mechanism 32, is often referred to as a "dial dog", as demonstrated in FIG. 4. These interfaces 38, 40 can vary greatly in design and configuration depending on the corresponding connectable mechanism. Gears, shrouding devices, elbows, arms, and the like are envisioned and generally discussed herein.

The interfaces 38, 40 are positioned at each of the distal ends of the drive shaft 42. In one embodiment, at least one of the interfaces 38, 40 will be integral to an end of the drive shaft 42, with the other end having a lockable tip 48, as shown in FIG. 4. The lockable tip 48 can include wings designed to lockably engage one of the interfaces 38, 40 not integral to the drive shaft 42 to facilitate assembly and repairs, wherein the lockable tip 48 of the drive shaft 42 can be disengaged from the respective interface to install or remove the drive shaft 42 from the meter reading module housing 34. Preferably, the tip 48 is engageable with the interface 40 communicating with the register index 16, as shown in FIG. 4. Specifically, a substantial portion of the drive shaft 42 is rotatable within the drive channel 35 and can thus be selectively removed from the channel 35. Further, the cross-section of the drive shaft 42 can be larger or smaller than the cross-section of the lockable tip 48.

Various commercial embodiments of the described drive system 36 employ various drive shaft 42 designs like those shown in FIGS. 4-5. For instance, U.S. Pat. No. 6,100,816 is directed to a meter reading module system designed for retrofitting to existing utility meters and is fully incorporated by reference herein. The '816 patent includes a common drive shaft 42 and corresponding drive channel 35 design. First, the drive shaft 42 of the '816 patent includes a plurality of longitudinal members 46 running parallel to both the longitudinal axis of the shaft 42 and the engageable drive channel 35. It should be noted that other variations on the design and layout of these longitudinal members 46 are available, with each typically resulting in a tapered shaft 42. Second, the longitudinal members 46 create an outer surface design for the shaft 42 of various spaced right angles. Third, the common drive shaft 42, and its longitudinal members 46, are typically tapered such that the overall shaft 42 cross-section or diameter at one end is measurably larger. Generally, the end proximate the first interface 38 connectable to the meter interface mechanism 26 has a larger shaft 42 cross-section. Each of the described structural features presents innate problems for the functionality of the shaft 42 within the drive channel 35, and the engagement with the mechanisms 26, 32.

The plurality of longitudinal members 46 and the right-angled shape created along the outer surfaces of the shaft 42 result in a substantially rectangular cross-section. This rectangular shape is not optimally compatible with conventional cylindrical drive channels 35. Similarly, the tapered effect of this common shaft 42 does not promote smooth or fluid rotational movement within the drive channel 35 since the relatively narrowed portion is susceptible to erratic movement due to the void or clearance between the narrowed portion and the inner surface of the drive channel 35. Both of the described structural design flaws cause inefficient and potentially damaging slop and wiggle in the rotation of the shaft 42 within the drive channel 35. The slop and wiggle effect of the design can translate through interlinking connections to the register index 16 and the meter 14 by way of the index interface mechanism 32 and the meter interface mechanism 26, respectively. As the shaft 42 erratically rotates within the drive channel 35, binding is likely, with the binding motion putting additional pressure on the interconnections and causing jumpy readings through the meter reading module 18 to the register index 16. As stated, this can damage the meter reading module, cause leaks, and even break precision gear mechanisms within the meter.

Figure 6:
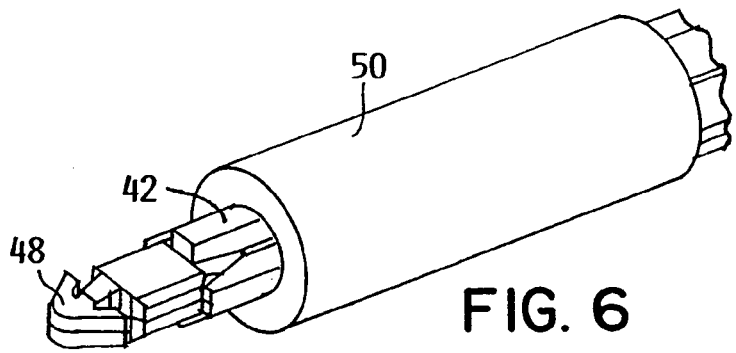
FIG. 6 is a perspective view of an embodiment of the shrouding device in accordance with the present invention.
Figure 7:
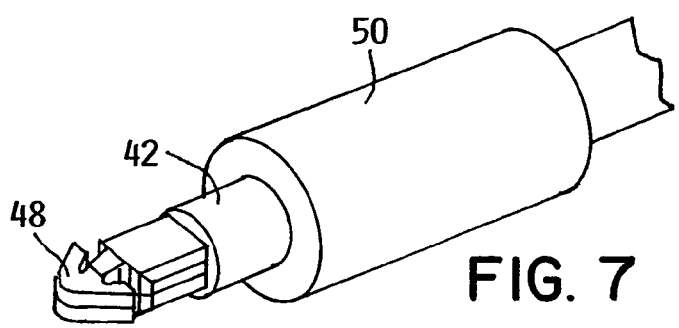
FIG. 7 is a perspective view of a shrouding device and an alternative drive shaft in accordance with an embodiment of the present invention.
Figure 8:
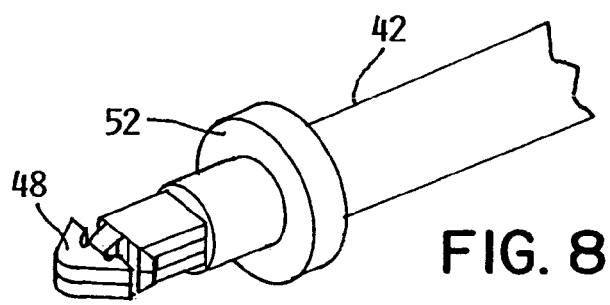
FIG. 8 is a perspective view of a shrouding device and an alternative drive shaft in accordance with an embodiment of the present invention.
Figure 9:
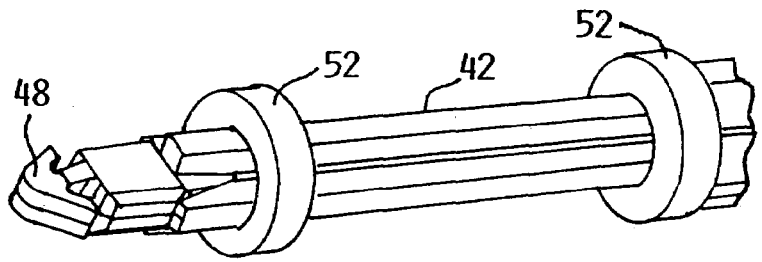
FIG. 9 is a perspective view of an embodiment of the shrouding device in accordance with the present invention.
Figure 10:
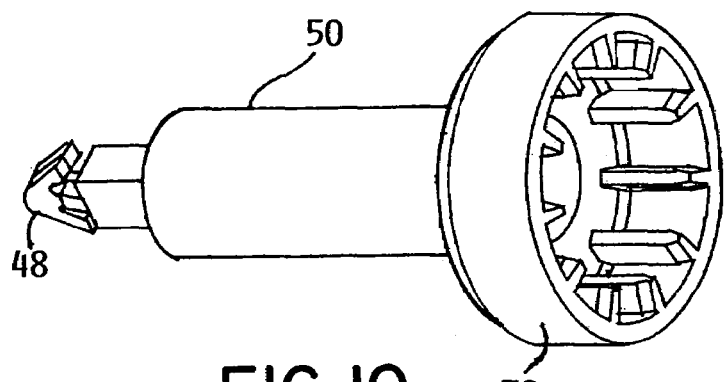
FIG. 10 is a perspective view of an embodiment of the shrouding device in accordance with the present invention.
Figure 11:
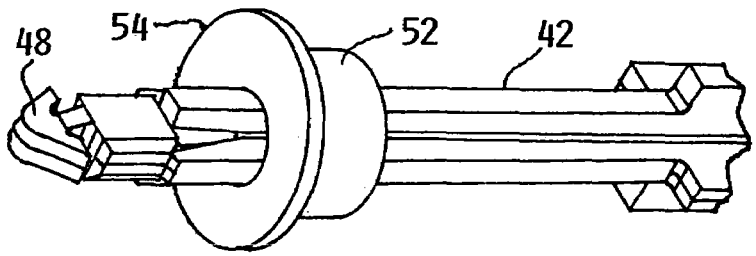
FIG. 11 is a perspective view of an embodiment of the shrouding device in accordance with the present invention.
Figure 12:
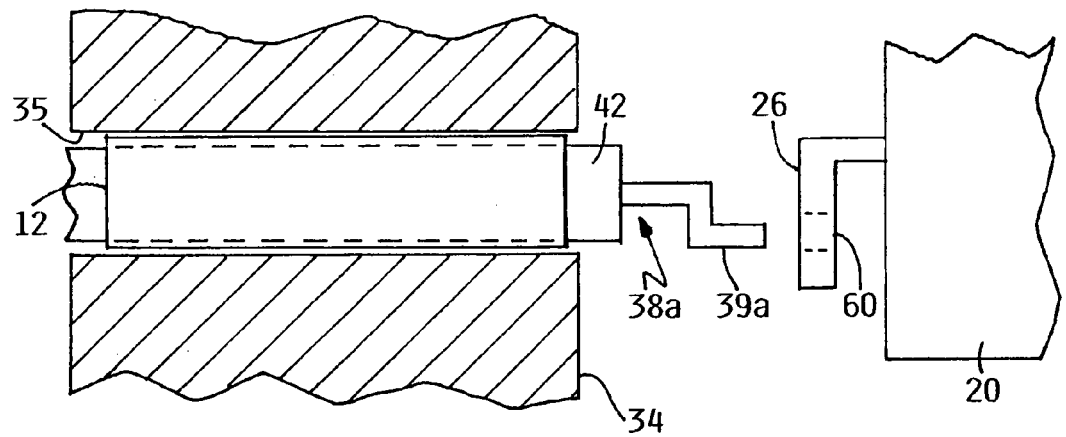
FIG. 12 is a partial side cross-section view of the interlinking of a meter reading module to a utility meter in accordance with an embodiment of the present invention.
Figure 13:
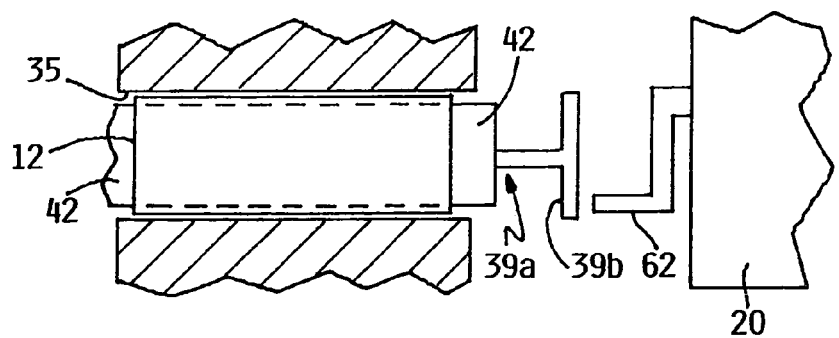
FIG. 13 is a partial side cross-section view of the interlinking of a meter reading module to a utility meter in accordance with an embodiment of the present invention.

Referring primarily to FIGS. 6-13, the at least one shrouding device 12 of the present invention is directed to substantially eliminating the erratic binding motion caused by conventional drive shaft 42 and drive channel 35 designs and interactions. One embodiment of the at least one shrouding device 12 can include a sleeve-like device 50 adapted to be received by at least a portion of the drive shaft 42, as shown in FIGS. 6-7, and 10. The shrouding sleeve 50 can surround an area around the surface of the shaft 42 equal to 360 degrees, or something less. For instance, a C-shaped or like configuration is envisioned. This shrouding sleeve 50 is shaped and sized to fit within the restraints of the particular drive channel 35, and have an inner diameter sized to receive a measurable portion of the drive shaft 42. For those engageable drive shafts 42 having a tapered effect, the sleeve 50 can be internally tapered such that the inner diameter of the sleeve 50 will substantially follow the taper of the shaft 42 while still following a constant path or angle of the drive channel 35. When a tapered drive channel 35 is included in the meter reading module housing 20, the tapering effect of an embodiment of the sleeve 50 will likewise remain constant along that drive channel 35 to facilitate precision rotation of the drive shaft 42. With such a sleeve 50 embodiment of the shrouding device 12, the conventional problems associated with jumpy or binding motion of the shaft 42 within the drive channel 35 is significantly reduced by eliminating the often undesirable motion of a rectangular cross-sectioned shaft 42 within a cylindrical channel 35, and the effects of channel 35 and/or shaft 42 tapering. The sleeve 50 can be employed just around the portion of the shaft 42 decreasing in angle on the taper, or it can include two distinct sleeve 50 devices spaced at distal portion of the shaft 42. Further, the sleeve 50 can be completely, or only partially, included within the confines of the channel 35. The present invention also includes employing a drive shaft 42 not having a rectangular-like cross-section. Embodiments of the present invention include a substantially cylindrical shaft 42 having a diameter, tapered or not, capable of receiving the at least one sleeve 50 within the channel 35 as described herein, as shown in FIGS. 7, and 12-13. This cylindrical shaft 42 and/or the sleeve 50 can be integrated, or connectable, to various interfaces as described. Generally, the sleeve 50, and other shrouding device 12 embodiments, will be constructed of a material promoting and enabling rotational fluidity or precisions. While polymeric materials, such as nylon, are envisioned, other materials furthering the goal of rotatability and non-binding motion can be employed as well without deviating from the spirit and scope of the present invention.

In other embodiments of the present invention, the at least one shrouding device 12 can include at least one bushing 52 employed at predefined portions of the shaft 42 to eliminate binding effects, as shown in FIGS. 8-9, and 11. The at least one bushing 52 can surround an area around the surface of the shaft 42 equal to 360 degrees, or something less. For instance, a C-shaped or like configuration is envisioned. The at least one bushing 52 will be sized and shaped to receive a portion of the shaft 42. One embodiment of the at least one bushing 52 will include a plurality of bushings 52 shrouding predefined portions of the shaft 42. For instance, two bushings 52 can be placed at portions of the shaft 42 aligned with ends of the channel 35 during operational rotation. Again, the inner diameter of the at least one bushing 52, like the sleeve 50 embodiments, can vary depending on the size of the receivable shaft 42 and its taper. Further, the outer diameter of the at least one bushing 52 will be shaped to maintain a relatively constant alignment with the channel 35 shape and/or taper. Certain embodiments of the at least one bushing 52 will include a lip portion 54 proximate an end portion of the bushing 52 substantially outside the confines of the drive channel 35 to promote stability and engagement, as shown in FIG. 11. In addition, at least one aperture can be drilled or otherwise included through a portion of the shaft 42 proximate the lip 54 to receive a pin, clip, or like device to maintain positioning of the at least one bushing 52 during operational rotation of the shaft 42. Spacers and other like devices can additionally be employed to fill gaps or voids along the shaft 42 and, in particular, to fill any gaps between the lip portion 54 and any pin or clip inserted around or through the shaft 42. In addition, embodiments of the present invention include the substantially cylindrical shaft 42 having a diameter, tapered or not, capable of receiving the at least one bushing 52 within the channel 35 as described herein, as shown in FIG. 8. This cylindrical shaft 42 and/or the at least one bushing 52 can be integrated, or connectable, to various interfaces as described. As with the sleeve 50 embodiments, the at least one bushing 52 is preferably constructed of a material promoting fluid non-binding mechanical rotation of the shaft 42 within the channel 35.

As described and shown, the shrouding devices 12 of the present invention can also be employed with drive shafts 42 having tapered portions, shafts 42 including the longitudinal members 46 or a relatively non-circular cross-section, shafts 42 not having tapered portions, and cylindrical shafts 42 having a substantially circular cross-section. When employed around such shafts 42, the shrouding device 12 provides increased stability during rotation, decreases noise and binding due to the self-lubricative nature of the embodiments of the at least one shrouding device 12, and provides other securement and operational benefits.

In addition to the solutions presented with the implementation of the at least one shrouding device 12, tapering effects of the drive channel 35 can also be remedied utilizing additional methods and apparatus to substantially reduce the negative effects of the taper. For instance, the drive channel 35 can be bored out to obtain a non-tapered inner surface of the drive channel 35. Further, tapes and other filler apparatus and techniques can be placed along at least a portion of the inner surface of the drive channel 35 and/or the shaft 42 to create a substantially non-tapered surface. Teflon or like tapes and/or securable materials can be placed along a portion of the drive channel 35 wall or the shaft 42.

While many drive channel 35 and drive shaft 42 designs are inherently problematic, there are often additional design flaws that contribute to undesirable binding rotation of the drive system 36 during operation. In operably attaching a meter reading module 18 intermediate the meter 14 and the register index 16, imprecise interfaces are often employed which do not functionally mimic the interconnection precision of the original structures. For instance, certain meter reading module systems manufactured and/or sold by Schlumberger Limited ("Schlumberger Module") or its affiliate companies to read and transmit utility meter consumption data to remote reading devices and networks have such innate design flaws.

In addition to the at least one shrouding device 12, various embodiments of the present invention will include first and/or second interfaces 38, 40 integral with, or thereby attachable to, the drive shaft 42 to facilitate rotational engagement with the meter mechanism 26 and/or the index mechanism 32, respectively. The structure and functionality of the interfaces 38, 40 are greatly dependent upon the structure and functionality of the corresponding mechanisms 26, 32.

One embodiment of the meter interface system shown in FIG. 12 is adapted to engage the meter interface mechanism 24 of specific meters, such as those manufactured and/or sold by American Meter Company. It is common for these certain meters to include a meter interface mechanism 24 having an interlinking aperture 60. Prior to installation of the intermediate meter reading module 18, the interlinking aperture 60 received a portion of the register index interface mechanism 32 such that rotation of the meter drive system 24 likewise communicated precise rotation to the register index 16. The Schlumberger Module and its first meter interface 38 designed to operate and interconnect with these unique meter interface mechanisms 24 generally includes a shrouding meter dog. As such, the rotational movement of the meter interface mechanism 24 is jumpy and binding since the first meter interface 38 is not continuously engaged in a smooth communication with the interlinking aperture 60. One first meter interface 38a of the present invention includes an interlocking arm 39a adapted for receipt by the interlinking aperture 60 to promote precise rotational communication from the meter interface mechanism 26, through the meter drive system 36, and to the index interface mechanism 32. It should be noted that any of the shrouding device 12 embodiments described herein can be employed with the intermediate meter reading module 18 in addition to the described first interface.

Another embodiment of the meter interface system shown in FIG. 13 is adapted to engage various other meter interface mechanisms 24 of specific meters, such as those manufactured and/or sold under Sprague or Schlumberger Limited. It is common for these certain meters to include a meter interface mechanism 24 having an L-shaped member 62. Prior to installation of the intermediate meter reading module 18, the L-shaped member 62 communicates with the register index interface mechanism 32 such that rotation of the meter drive system 24 likewise communicated precise rotation to the register index 16. The Schlumberger Module and its first meter interface 38 designed to operate and interconnect with these unique meter interface mechanisms 24 generally includes a shrouding meter dog. As such, the rotational movement of the meter interface mechanism 24 is jumpy and binding since the first meter interface 38 is not continuously engaged in a smooth communication with the member 62. One first meter interface 38b of the present invention includes a T-shaped arm 39b adapted for abuttable engagement with the L-shaped member 62 of the meter interface mechanism 26 upon rotation. The T-shaped arm 39b is substantially perpendicular to the member 62 such that rotation of the member 62 due to fluid flow through the meter engages a perpendicularly oriented portion of the arm 39b to enable rotational communication. The engagement of the interlocking arm 39b and the L-shaped member 62, consequently, promotes precise rotational communication from the meter interface mechanism 26, through the meter drive system 36, and to the index interface mechanism 32. It should be noted that any of the shrouding device 12 embodiments described herein can be employed with the intermediate meter reading module 18 in addition to the described first interface.

Alternative embodiments of the first meter interfaces 38 and the second index interfaces 40 can include employment of matable gear devices, shrouding devices, and other known structures and techniques that provide precision mechanical interfaces between index interface mechanisms 32 and meter interface mechanisms 26. For instance, preferred embodiments of the first meter interface 38 for a particular application will employ systems and/or devices substantially similar to those index interface mechanisms employed prior to installment of the meter reading module 18 on a specific meter 14. As such, precision matability and rotational communication will be substantially maintained after installing the meter reading module 18 as was present with the original index 16 and meter 14 systems and component engagements.

In operation, the at least one shrouding device 12 is shroudably engaged with at least a portion of the drive shaft 42 at the manufacturing and/or assembly of the various meter components and systems, or is installed in the field to repair existing or operational meters 14 and meter reading modules 18. Further, the shaft 42 of the meter reading module 18 can be equipped with the at least one shrouding device 12 during manufacturing. Certain embodiments will include manufacturing a substantially cylindrical shaft 42 to replace shafts having undesirable longitudinal members 42 and/or a rectangular cross-section for use in retrofitting the meter reading module 18.

One method of installation in the field includes removing the register index 16 from the intermediate meter reading module 18, and then removing the meter reading module 18 from the meter 18. Next, at least one of the first and second interfaces 38, 40 is disengaged from a corresponding end portion of the shaft 42, such as disengaging the shaft tip 48 from the respective interface 38 or 40. Once the at least one interface has been removed, the remaining module drive system 36 (i.e., the drive shaft 42 and remaining interface) can be removed from the housing 34. At this point, the shaft 42, in particular, can be removed from the drive channel 35. Certain embodiments of the present invention include at this point replacing the original shaft 42 having longitudinal members 46 or a rectangular-like cross-section with the replacement substantially cylindrical shaft 42. Once the meter reading module drive system 36 and its components have been removed or replaced, the at least one shrouding device 12 can be secured around the shaft 42. Alternatively, if a single bushing 52 is being employed, the shaft 42 can remain within the channel 35 and the bushing 52 can be secured around the portion of the shaft 42 proximate the disengaged interface. If a sleeve 50, or bushing 52 at each end portion of the shaft 42, is employed, then the appropriate shrouding device(s) 12 can be secured and the shaft 42 can be re-inserted through the drive channel 35, and the disengaged interface can be reconnected. Next, each of the register index 16 and meter reading module 18 systems can be reconnected as they were prior to the repair.

In embodiments employing at least an improved first meter interface 38a or 38b, the drive shaft 42 is generally replaced with a replacement shaft 42, rectangular or cylindrical, comprising the interface 38a, 38b and the same, or similar, steps for securing the at least one shrouding device 12 to the shaft 42 can be performed.

Those skilled in the art will appreciate that other embodiments in addition to the ones described herein are indicated to be within the scope and breadth of the present application. Accordingly, the applicant intends to be limited only by the claims appended hereto.

The invention claimed is:

1. A method of retrofitting a utility meter reading module, wherein the meter reading module is operably positionable between a meter housing and a register index, the meter reading module including a meter reading module drive shaft, a drive channel housing adapted to receive the meter reading module drive shaft for rotational movement, and a clearance distance between the meter reading module drive shaft and the drive channel housing, comprising the steps of:
   accessing the meter reading module;
   opening the meter reading module and removing the meter reading module drive shaft;
   positioning a shrouding device around at least a portion of the meter reading module drive shaft to reduce the clearance distance between the meter reading module drive shaft and the drive channel housing;
   inserting the shrouded meter reading module drive shaft within the drive channel housing of the meter reading module;
   closing the meter reading module; and
   reinstalling the meter reading module in operational position to the meter housing and the register index.

2. The method of claim 1, further comprising removing a register index interface device from an end portion of the meter reading module drive shaft prior to removing the meter reading module drive shaft.

3. The method of claim 1, wherein the step of positioning the shrouding device includes positioning a sleeve around at least a portion of the meter reading module drive shaft.

4. The method of claim 3, wherein the sleeve is constructed of a polymeric material.

5. The method of claim 1, wherein the step of positioning the shrouding device includes positioning at least one bushing device around a portion of the meter reading module drive shaft.

6. The method of claim 5, wherein the at least one bushing is constructed of a polymeric material.

7. The method of claim 1, wherein the meter reading module drive shaft is substantially cylindrical.

8. The method of claim 1, wherein the meter reading module drive shaft includes a plurality of longitudinal members to define a shaft having a substantially non-circular cross-section.

9. A system for retrofitting a meter reading module operably connected to a utility meter, comprising:
   a meter reading module operably positionable intermediate a utility meter and a register index, the meter reading module having
      a first interface adapted to operably engage the utility meter;
      a second interface adapted to operably engage the register index;
      a drive shaft intermediate and connectable to each of the first and second interfaces; and
      a drive shaft channel for rotatably receiving at least a portion of the drive shaft; and
   at least one shrouding device retrofittably installable in the meter reading module so as to operably surround at least a portion of the drive shaft to substantially stabilize rotation of the drive shaft within the drive shaft channel.

10. The system of claim 9, wherein the drive shaft is longitudinally tapered.

11. The system of claim 9, wherein the at least one shrouding device is a sleeve engageable around at least a portion of the drive shaft to reduce a void between an outer surface of the drive shaft and an inner surface of the drive shaft channel.

12. The system of claim 10, wherein the at least one shrouding device is a sleeve engageable around at least a portion of the drive shaft, the sleeve including an inner diameter and an outer diameter, wherein the inner diameter is longitudinally tapered to measurably match the longitudinal taper of the drive shaft and the outer diameter measurably matches the angle of the inner surface of the drive shaft channel.

13. The system of claim 11, wherein the sleeve is constructed of a polymeric material to reduce friction during operational rotation of the drive shaft within the drive shaft channel.

14. The system of claim 9, wherein the at least one shrouding device is at least one bushing engageable proximate at least one end of the drive shaft to reduce a void between an outer surface of the drive shaft and an inner surface of the drive shaft channel proximate the at least one end.

15. The system of claim 14, wherein the at least one bushing is constructed of a polymeric material to reduce friction during operational rotation of the drive shaft within the drive shaft channel.

16. The system of claim 14, wherein the at least one bushing includes two bushings each engageable proximate end portions of the drive shaft.

17. The system of claim 16, wherein at least one of the two bushings is constructed of a polymeric material to reduce friction during operational rotation of the drive shaft within the drive shaft channel.

18. The system of claim 9, wherein the drive shaft, the first interface, and the second interface define a module drive system intermediate the meter and the register index such that rotational communication is translated from the meter, through the module drive system, and to the register index.

19. The system of claim 18, wherein the meter includes a meter interface mechanism adapted to variably rotate in accordance with fluid flow through the meter.

20. The system of claim 19, wherein the meter interface mechanism includes an interlinking aperture and the first meter interface includes an arm insertable within the interlinking aperture to communicate rotations from the meter interface mechanism to the meter reading module.

21. The system of claim 19, wherein the meter interface mechanism includes a substantially L-shaped member and the first meter interface includes an elbow member capable of abuttable communication with the L-shaped member to communicate rotations from the meter interface mechanism to the meter reading module.

22. The system of claim 9, wherein the drive shaft is substantially cylindrical.

23. The system of claim 9, wherein the drive shaft includes a plurality of longitudinal members to define a shaft having a substantially non-circular cross-section.

24. A system for retrofitting a meter reading module operably connected to a utility meter, comprising:
   a meter reading module operably positionable intermediate a utility meter and a register index, the meter reading module having
      a first means for operably engaging the utility meter;
      a second means for operably engaging the register index;
      drive means intermediate and connectable to each of the first and second means for rotational movement; and
      a drive channel for rotatably receiving at least a portion of the drive means; and
   means for substantially stabilizing rotation of the drive means within the drive channel that is retrofittably installable in the drive channel after the meter reading module has been installed in the field.

25. The system of claim 24, wherein the drive means is longitudinally tapered.

26. The system of claim 24, wherein the means for substantially stabilizing rotation of the drive means includes a sleeve slidably engageable around at least a portion of the drive means to reduce the void between the outer surface of the drive means and the inner surface of the drive channel.

27. The system of claim 25, wherein the means for substantially stabilizing rotation of the drive means includes a sleeve having an inner diameter and an outer diameter, wherein the inner diameter is longitudinally tapered to measurably match the longitudinal taper of the drive means and the outer diameter follows the angle of the inner surface of the drive channel.

28. The system of claim 24, wherein the means for substantially stabilizing rotation of the drive means includes at least one bushing slidably engageable proximate at least a portion of the drive means to reduce the void between the outer surface of the drive means and the inner surface of the drive channel proximate the at least one end.

29. The system of claim 28, wherein the at least one bushing includes a lip portion shaped to abutably align an end of the at least one bushing against the drive channel.

30. The system of claim 24, wherein the utility meter includes a meter interface means adapted to variably rotate in accordance with fluid flow through the meter.

31. The system of claim 30, wherein the meter interface means includes an interlinking aperture and the first means for operably engaging the utility meter includes an arm insertable within the interlinking aperture to communicate rotations from the meter interface means to the meter reading module.

32. The system of claim 30, wherein the meter interface means includes a substantially L-shaped member and the first means for operably engaging the utility meter includes an elbow member capable of abuttable communication with the L-shaped member to communicate rotations from the meter interface means to the meter reading module.

33. A kit for repairing the rotational defects of a utility meter reading module, wherein the meter reading module is operably mountable intermediate a utility meter and a register index, the meter reading module including a meter reading module drive shaft rotatable within a meter reading module drive channel, comprising:

at least one shrouding device operably surrounding at least a portion of the meter reading module drive shaft to substantially reduce rotational wiggle of the drive shaft within the meter reading module drive channel during operation; and a set of instructions defining a method for retrofitting the meter reading module with the at least one shrouding device, the instructions including the steps of:

accessing the meter reading module;

opening the meter reading module and removing the meter reading module drive shaft;

positioning the at least one shrouding device around at least a portion of the meter reading module drive shaft to reduce the clearance distance between the drive shaft and the drive channel during rotational operation;

inserting the shrouded drive shaft within the drive channel;

closing the meter reading module; and reinstalling the meter reading module in operational position to the meter housing and the register index.

34. The kit of claim 33, wherein the meter reader module drive shaft is longitudinally tapered.

35. The kit of claim 34, wherein the at least one shrouding device is a sleeve slidably engageable around at least a portion of the meter reading module drive shaft to reduce the clearance between the outer surface of the drive shaft and the inner surface of the drive channel.

36. The kit of claim 34 wherein the at least one shrouding device is a sleeve including an inner diameter and an outer diameter, wherein the inner diameter is longitudinally tapered to measurably match the longitudinal taper of the meter reading module drive shaft and the outer diameter follows the angle of the inner surface of the drive channel.

37. The kit of claim 35, wherein the sleeve is constructed of a polymer material to reduce friction during operational rotation of the drive shaft within the drive channel.

38. The kit of claim 37, wherein the polymer sleeve includes nylon to provide lubrication characteristics during operational rotation of the drive shaft within the drive channel.

39. The kit of claim 34, wherein the at least one shrouding device is at least one bushing slidably engageable around at least a portion of the drive shaft to reduce the clearance between the outer surface of the drive shaft and the inner surface of the drive channel proximate the at least one end.

40. The kit of claim 39, wherein the at least one bushing is constructed of a polymer material to reduce friction during operational rotation of the drive shaft within the drive channel.

41. The kit of claim 40, wherein the at least one bushing includes two bushings each slidably engageable proximate end portions of the drive shaft.

42. The kit of claim 41, wherein two bushing are constructed of polymer materials to reduce friction during operational rotation of the drive shaft within the drive channel.

43. The kit of claim 39, wherein the at least one bushing includes a lip portion shaped to abutably align an end of the at least one bushing against the drive channel.

44. The kit of claim 33 wherein the drive shaft is substantially cylindrical.

45. The kit of claim 33, wherein the drive shaft includes a plurality of longitudinal members to define a shaft having a substantially non-circular cross-section.

46. A method of retrofitting a utility meter reading module, wherein the meter reading module is operably positionable between a meter housing and a register index, the meter reading module including a first meter reading module drive shaft, a drive channel housing adapted to receive the first meter reading module drive shaft for rotational movement, and a clearance distance between the first meter reading module drive shaft and the drive channel housing, comprising the steps of:

accessing the meter reading module;

opening the meter reading module and removing the first meter reading module drive shaft, wherein the first meter reading module drive shaft is substantially non-cylindrical;

replacing the first meter reading module drive shaft with a second replacement meter reading module drive shaft, wherein at least a portion of the second replacement meter reading module drive shaft is substantially cylindrical;

inserting the second replacement meter reading module drive shaft within the drive channel housing of the meter reading module;

closing the meter reading module; and reinstalling the meter reading module in operational position to the meter housing and the register index.

47. The method of claim 46, wherein the meter includes a meter interface mechanism to rotationally translate fluid flow through the meter, the meter interface mechanism having an interlinking aperture, and the second replacement meter reading module drive shaft includes a meter interface having an arm insertable within the interlinking aperture to communicate rotations from the meter interface mechanism to the meter reading module.

48. The method of claim 46, wherein the meter includes a meter interface mechanism to rotationally translate fluid flow through the meter, the meter interface mechanism having a substantially L-shaped member, and the second replacement meter reading module drive shaft includes a meter interface having an elbow member capable of abuttable communication with the L-shaped member to communicate rotations from the meter interface mechanism to the meter reading module.

* * * * *